United States Patent
Hsieh et al.

(10) Patent No.: US 7,586,789 B2
(45) Date of Patent: Sep. 8, 2009

(54) METHOD FOR ADJUSTING PROGRAMMING/ERASING TIME IN MEMORY SYSTEM

(75) Inventors: PingFu Hsieh, Tainan (TW); KuoCheng Weng, Kaohsiung (TW); LiangHung Wang, Tainan (TW); HsinFu Luo, Tainan (TW)

(73) Assignee: Beedar Technology Inc., Tainan (TW)

( * ) Notice: Subject to any disclaimer, the term of this patent is extended or adjusted under 35 U.S.C. 154(b) by 137 days.

(21) Appl. No.: 11/875,830

(22) Filed: Oct. 19, 2007

(65) Prior Publication Data

US 2008/0037348 A1 Feb. 14, 2008

Related U.S. Application Data

(63) Continuation-in-part of application No. 10/907,225, filed on Mar. 24, 2005, now abandoned.

(51) Int. Cl.
*G11C 11/34* (2006.01)
*G11C 16/04* (2006.01)

(52) U.S. Cl. .............................. 365/185.22; 365/185.11

(58) Field of Classification Search ............ 365/185.11, 365/185.22
See application file for complete search history.

(56) References Cited

U.S. PATENT DOCUMENTS

| | | | | |
|---|---|---|---|---|
| 6,046,939 | A * | 4/2000 | Noda et al. | 365/185.09 |
| 6,345,367 | B1 * | 2/2002 | Sinclair | 714/7 |
| 6,853,585 | B2 * | 2/2005 | Lee et al. | 365/185.22 |
| 7,149,110 | B2 * | 12/2006 | Tran et al. | 365/185.03 |

* cited by examiner

*Primary Examiner*—Ly D Pham

(57) ABSTRACT

A method for adjusting a programming/erasing time in a memory system is disclosed. In one embodiment, a programming/erasing step is executed for writing data into the memory system, wherein the programming/erasing step is executed until a programming/erasing time and/or a cycle number per unit of time is reached. Then, a verification step is executed for verifying the data written into the memory system to determine if the data written into the memory system is correct so as to obtain a verification result. When the verification result is incorrect, a setting step is executed for setting the programming/erasing time and/or the cycle number per unit to new values. Thereafter, the programming/erasing step is repeatedly executed for writing the data into the memory system after the programming/erasing time and/or a cycle number per unit of time is set to the values.

14 Claims, 7 Drawing Sheets

FIG. 2

| code | time (ms) |
|---|---|
| 000 | 0.01 |
| 001 | 0.02 |
| 010 | 0.03 |
| 011 | 0.04 |
| 100 | 0.05 |
| 101 | 0.06 |
| 110 | 0.07 |
| 111 | 0.08 |

| | code | cycle |
|---|---|---|
| 0 | 00 | 10 |
| 1 | 01 | 20 |
| 2 | 10 | 30 |
| 3 | 11 | 40 |

FIG. 3

| MODE | BIT [1] | BIT [0] |
|---|---|---|
| ODD PARITY CHECK | 0 | 0 |
| EVEN PARITY CHECK | 1 | 0 |
| LRC | 1 | 1 |
| CRC | 0 | 1 |

FIG. 4

METHOD FOR ADJUSTING PROGRAMMING/ERASING TIME IN MEMORY SYSTEM

CROSS-REFERENCE TO RELATED APPLICATIONS

This application is a continuation-in-part of U.S. application Ser. No. 10/907,225, filed on Mar. 24, 2005 now abandoned, hereby incorporated by reference as it fully set forth herein.

BACKGROUND OF THE INVENTION

1. Field of the Invention

The present invention relates to the field of electronic data storage devices, and more particularly to a method for adjusting a programming/erasing time in a memory system.

2. Description of Related Art

In a conventional memory system, its programming/erasing time is generally defined by experimental results of the specific memory cell, and is generally fixed throughout the entire life of the memory system. There is no way to adjust the programming/erasing time quickly and conveniently for an existing memory system or even for a new memory system. Thus, to re-produce a new product with a new programming/erasing time, the only way is to tape-out and change new mask.

When a memory unit (device) is a memory system has been used for a certain period of time, its physical performance is generally decreasing with time, so that it is quite often that the original programming/erasing time of the system is not sufficient for data to be read from or written into the memory unit successfully, and thus the memory system is considered as failure. However, the memory system considered as failure may still be operable if its programming/erasing time can be increased for allowing the data to be read from or written into the memory unit successfully. It is particularly important for a user who needs to keep his memory system for a longer period of time.

On the other hand, for a memory system of RFID (Radio Frequency IDentification), the voltage applied thereto is decreasing with the distance between a user and the memory system of RFID. With a longer distance, the voltage applied to the memory system of RFID wirelessly becomes smaller, and thus more programming/erasing time is required for the data to be read or written from/into a RFID memory unit of the system successfully. Thus, the fixed programming/erasing time in the conventional memory system cannot satisfy the requirement of the RFID memory system.

Therefore, it is desirable to provide a method for adjusting a programming/erasing time in a memory system so as to overcome the inconvenient design and disadvantages of the conventional memory unit, and to meet the requirement of the RFID memory unit.

SUMMARY OF THE INVENTION

One embodiment of the present invention provides a method for adjusting a programming/erasing time in a memory system. The method comprises initializing the programming/erasing time to an initial programming/erasing time value; executing a programming/erasing step for writing data into the memory system, wherein the programming/erasing step is executed until the programming/erasing time is reached; executing a first verification step for verifying the data written into the memory system to determine if the data written into the memory system is correct so as to obtain a verification result; when the verification result is incorrect, executing a setting step for setting the programming/erasing time to a new programming/erasing time value which is smaller than or equal to a predetermined maximum time value, for example, increasing the programming/erasing time; and repeatedly executing the programming/erasing step for writing the data into the memory system after the programming/erasing time is set to the new programming/erasing time value. The method further comprises repeatedly executing the first verification step after the step of repeatedly executing the programming/erasing step is performed. The method further comprises repeatedly executing the setting step, the programming/erasing step and the first verification step in sequence, when the verification result is incorrect. The memory system can be such as a memory system of RFID In another embodiment, the initial programming/erasing time value is stored in a configuration block of the memory system, and the method further comprises modifying the configuration block to update the initial programming/erasing time value to the new programming/erasing time value.

In another embodiment, the method further comprises initializing an cycle number per unit of time to an initial cycle number value, wherein the programming/erasing step is executed until the cycle number within one unit of time is reached, and when the verification result is incorrect, the setting step is executed for setting the cycle number per unit of time to a new cycle number value which is smaller than or equal to a predetermined maximum cycle number value, for example, increasing the cycle number per unit of time. In another embodiment, the initial cycle number value is stored in a configuration block of the memory system, and the method further comprises: modifying the configuration block to update the initial cycle number value to the new cycle number value.

In another embodiment, the method further comprises selecting a predetermined check sum method; executing a read step for reading data from the memory system; and executing a second verification step for verifying the data read from the memory system with the predetermined check sum method. The method further comprises repeatedly executing the read step and the second verification step, when the predetermined check sum method finds errors in the data read from the memory system.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

FIG. 2 depicts a schematic diagram showing a configuration block on the memory unit according to an embodiment of the present invention;

FIG. 3 depicts tables used for explaining setting up the programming/erasing time of the memory unit according to an embodiment of the present invention;

FIG. 4 depicts a table used for explaining setting up a check sum mode according to an embodiment of the present invention;

DETAILED DESCRIPTION

Figure 1:
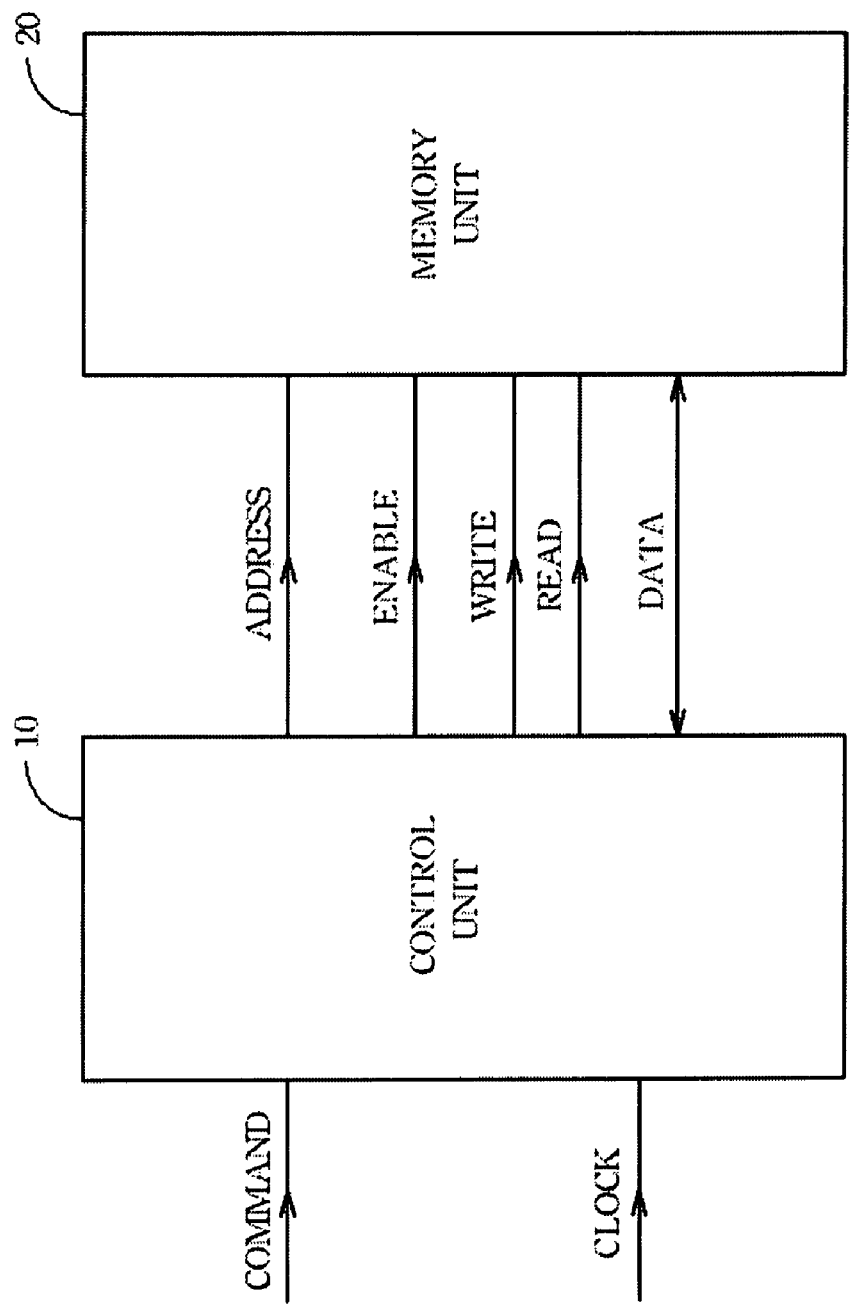
FIG. 1 depicts a schematic functional block diagram showing a control unit and a memory unit according to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The present invention is directed to a method for overcoming the unchangeable programming/erasing time by increasing the programming/erasing time and/or cycle number per unit of time (such as one second). Further, the method of the present invention can be divided into passive and active procedures for adjusting a programming/erasing time in a memory system. The difference between the passive procedure and the active procedure for adjusting the programming/erasing time is that active procedure modifies or re-writes a configuration block into the memory block of the system, but the passive procedure doe not. A feature of the passive programming/erasing time of the present invention includes multi-combinational methods of iterating time and/or cycle number per unit of time to properly adjust the programming/erasing time if the programming/erasing time is not adequate to a memory unit of the memory system. For the passive procedure, since the configuration block is not modified, the iteration of time and/or cycle number per unit of time may be needed again when the memory system is re-activated. The active procedure not only verifies and corrects the programming/erasing time properly, but also writes the configuration block with the proper programming/erasing time into the memory unit, and thus the invention may adjust the programming/erasing time properly which can be simultaneously to be adapted in the current characteristics of the memory unit.

The above features of the present invention are performed in a write mode of the system including the memory unit and the control unit. In a read mode of the system, a verifying method is employed in the data path between the memory unit and the control units to make the data read out from the memory unit carry along with checksums. Various verifying methods can be selected for use in the present invention in accordance with different types of data stream.

Hereinafter, the system and the configuration block of the present invention are explained.

Referring to FIG. 1, FIG. 1 depicts a schematic functional block diagram showing a memory system including a control unit 10 and a memory unit 20 according to an embodiment of the present invention, wherein a CLOCK signal is an input signal of the system clock; and an ENABLE signal is used to enable a memory unit 20. If a COMMAND signal is ready for writing, the control unit 10 outputs ADDRESS and DATA information and a WRITE signal to the memory unit 20. If the COMMAND signal is ready for reading, the control unit 10 provides ADDRESS and READ signals to the memory unit 20, and then retrieves DATA information form the memory unit 20.

Figure 2:
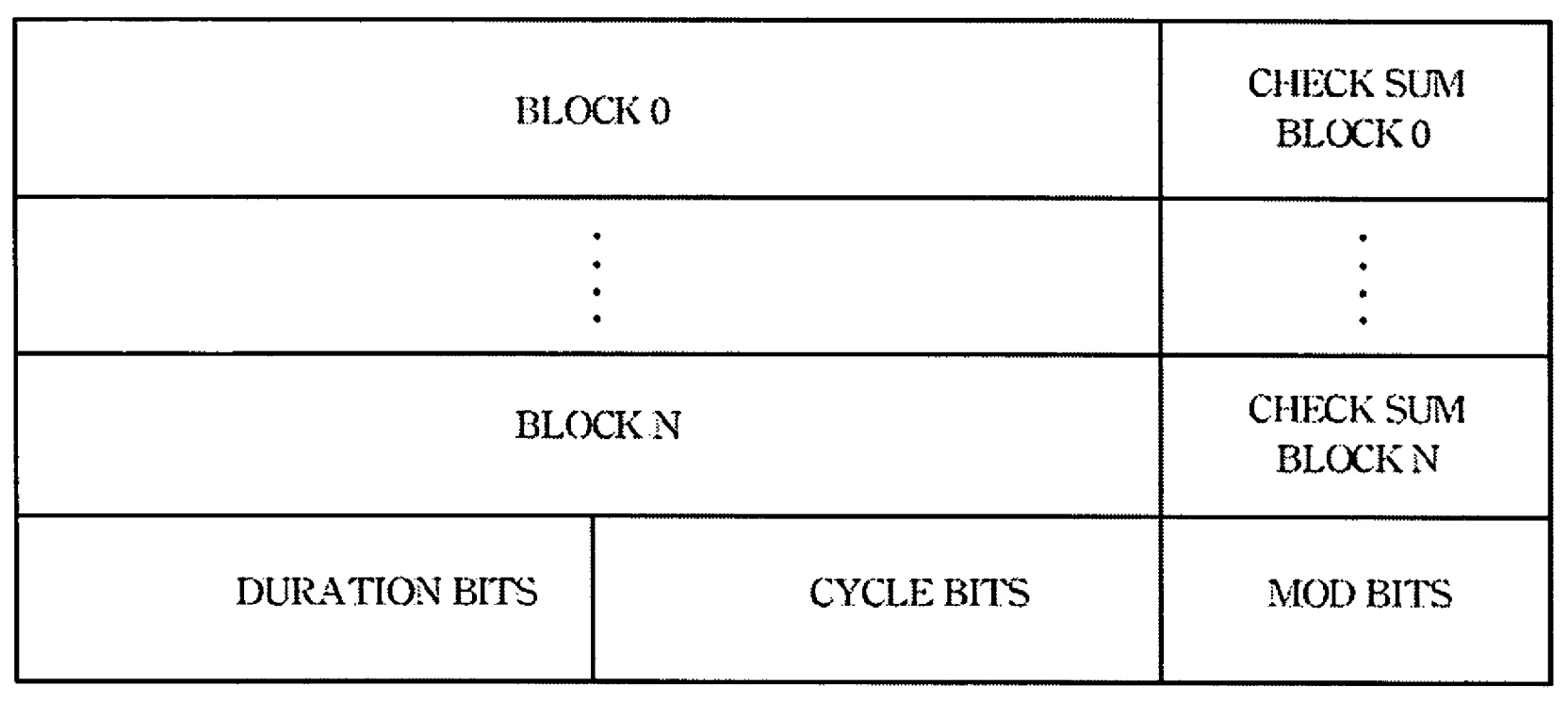

Referring to FIG. 2, FIG. 2 depicts a schematic diagram showing a configuration block on the memory unit according to an embodiment of the present invention, wherein the configuration block contains the records of programming/erasing duration (time) bits, cycle (number) bits, a checksum for each block and check sum mode bits.

Referring to FIG. 3, FIG. 3 depicts tables used for explaining setting up the programming/erasing time of the memory unit according to an embodiment of the present invention. As shown in FIG. 3, a table of programming/erasing time codes corresponding to programming/erasing time values; and a table of cycle number codes corresponding to cycle number values per unit of time are first stored in the configuration block. The settings of the programming/erasing time and cycle number per unit of time can be obtained by looking up the tables. The tables shown in FIG. 3 are merely stated as an example for explanation, and embodiments of the present invention are not limited thereto. For example, different codes can be arranged for representing different programming/erasing time values and cycle number values per unit of time.

Referring to FIG. 4, FIG. 4 depicts a table used for explaining setting up a check sum mode according to an embodiment of the present invention. The check sum procedure has four modes including odd parity check, even parity check, longitudinal redundancy check (LRC), and cyclic redundancy check (CRC). The BITs [0:1] in the check sum procedure bits (MOD BITS) are designed to alter the check sum procedure to one of the modes. When the BITs [0:1] are equal to 00, the mode with odd parity check is asserted. When the BITs [0:1] are equal to 01, the mode with even parity check is asserted, wherein a parity bit is in incorporated into each bit, byte, or block in parity check mode. When the BIT [0:1] is equal to 11, each LRC check is generated by the XOR gated with recursion in each byte in LRC mode. The LRC algorithm is that the transmitted value extended formatted bytes is appended to a LRC byte and a data block. When the BIT [0:1] is equal to 10, a CRC mode is enabled. The CRC algorithm is calculated by the dividing way of the polynomial in the logic unit. The CRC polynomial value of the memory data includes the appended CRC byte. The table shown in FIG. 4 is merely stated as an example for explanation, and embodiments of the present invention are not limited thereto. For example, different BITs [0:1] can be arranged for representing different check sum modes.

Figure 5:
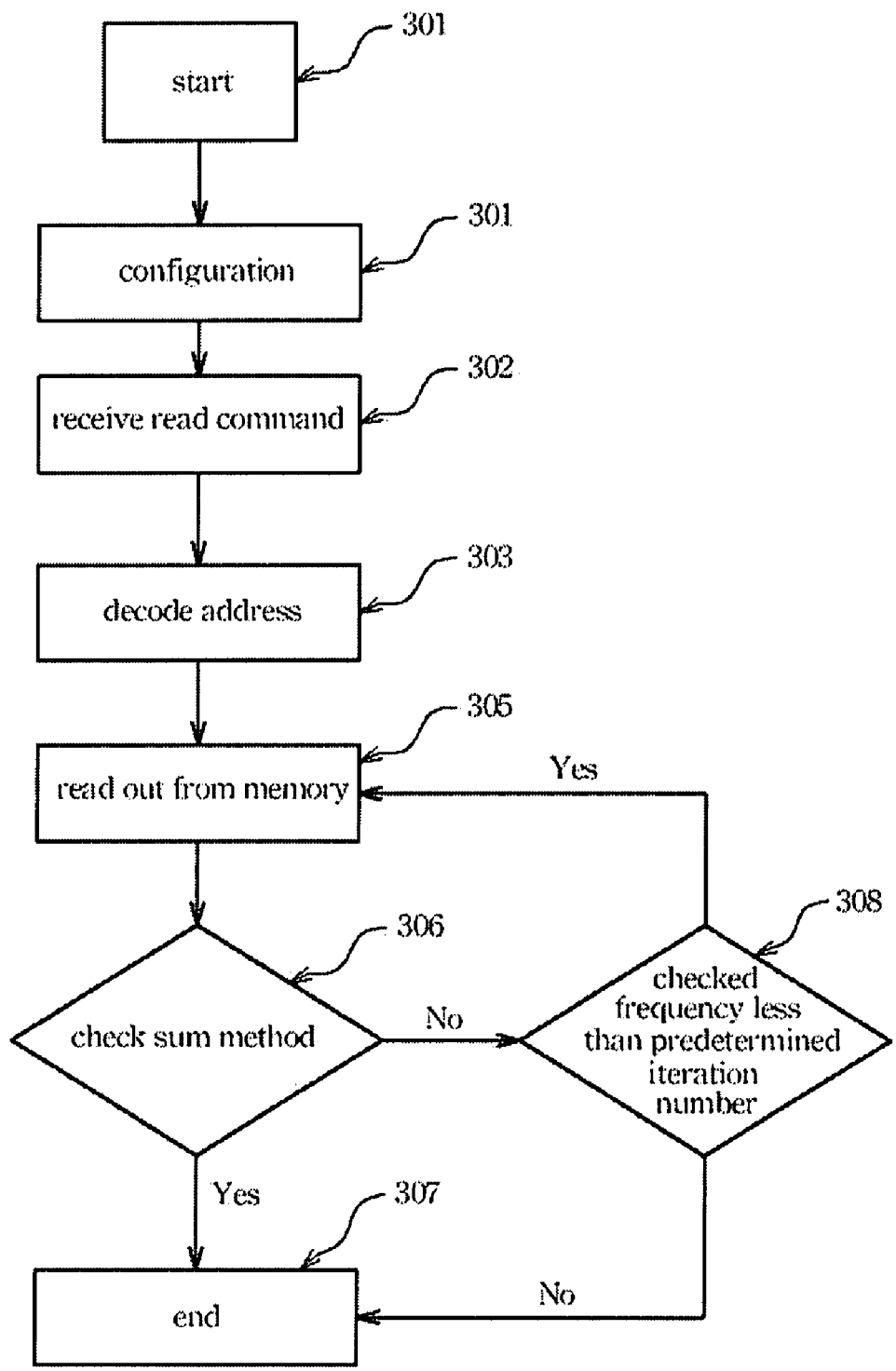
FIG. 5 depicts a schematic flow chart showing the check sum procedure flow in a read mode according to an embodiment of the present invention.

Referring to FIG. 1 and FIG. 5, FIG. 5 depicts a schematic flow chart showing the check sum procedure flow in a read mode according to an embodiment of the present invention.

The check sum procedure begins at step 301. Then, the control unit 10 reads a check sum mode recorded from the configuration block in the memory unit 20 (step 302), and sets its mode. When the control unit 10 receives a read command (step 303) from a user, the control unit 10 decodes a selected address at which the data to be read is located (step 304). Thereafter, the control unit 10 sends the read signal and the selected address to the memory unit 20, and reads back the data at the selected address (step 305). Then, the data is verified by a predetermined check sum method (step 306). The predetermined check sum method can be selected from various check sum methods including odd or even parity check, longitudinal redundancy check (LRC), and cyclic redundancy check (CRC), such as shown in FIG. 3 illustrating those check sum methods and represented code. Moreover, the read command contains a predetermined iteration number. For instance, the predetermined iteration number is set to 5 if the check sum method (step 306) finds errors in the data and the verified iteration (steps 305 and 306) will run five times to gain an integrity result. There are two situations that check sum flow (step 306) goes to the end (step 307), wherein one is check sum method (step 306) finds no error in the data, and the other is that the iterations has reached the predetermined (maximum) iteration number (step 308). At step 307, the data is ready to be sent out.

In the following, embodiments of the present invention are used for explaining the active and passive methods for adjusting programming/erasing time in a memory system.

Figure 6:
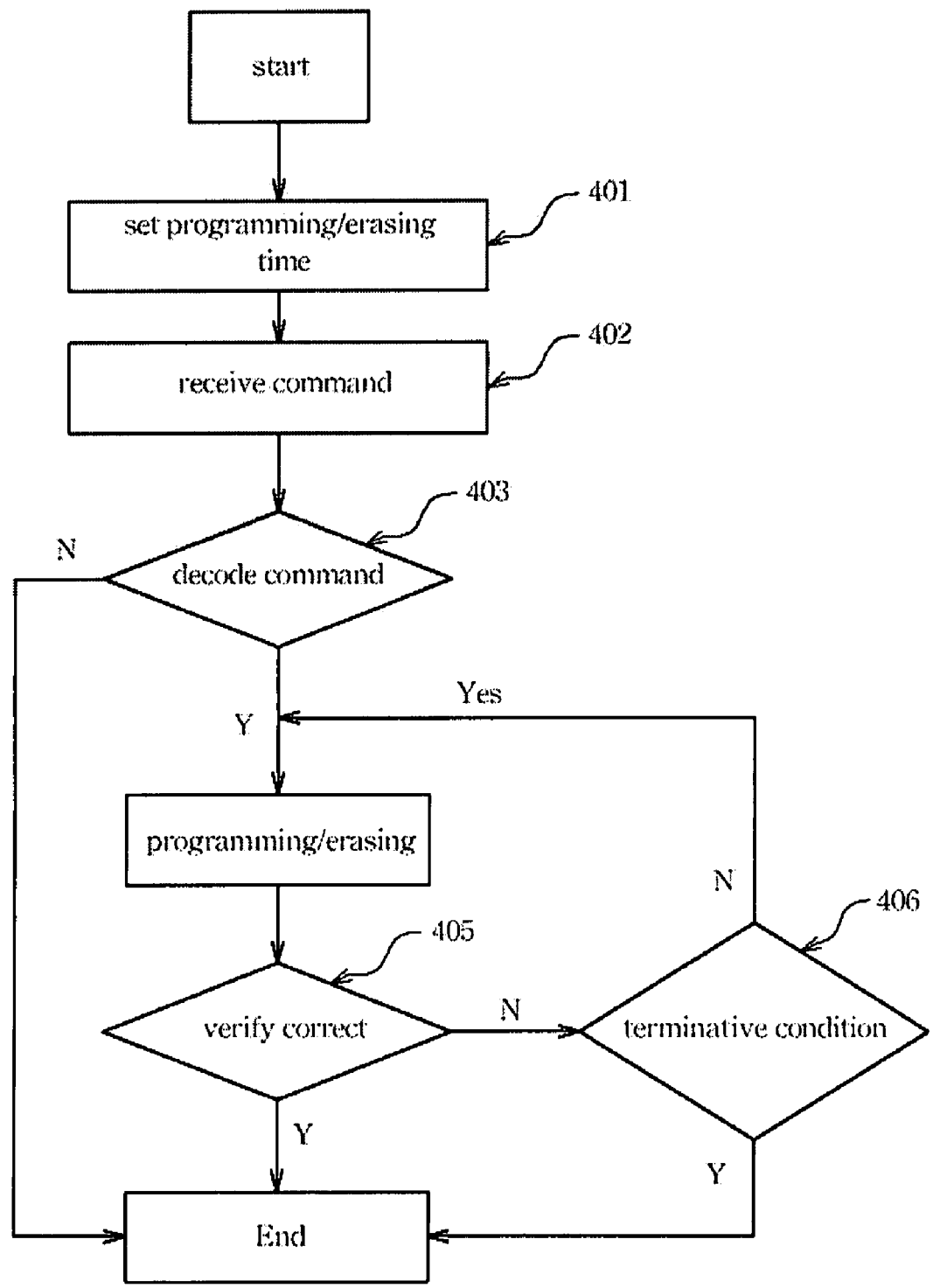
FIG. 6 depicts a schematic flow chart showing a passive programming/erasing function in a write mode according to an embodiment of the present invention.

Referring to FIG. 1 and FIG. 6, FIG. 6 depicts a schematic flow chart showing a passive programming/erasing function in a write mode according to an embodiment of the present invention. In this embodiment, the control unit 10 first reads an initial time index of programming/erasing time from the configuration block in the memory unit 20, and then obtains the setting programming/erasing time by looking up the time index in the table as shown in FIG. 3 (step 401). For example, when the time index is 000001, its corresponding programming/erasing time is 0.01 ms according to the table as shown in FIG. 3. Similarly, the control unit 10 also reads an initial cycle index of cycle number per unit of time from the configuration block in the memory unit 20 and then obtains the setting cycle number per unit of time by looking up the time index in the table as shown in FIG. 3.

When the control unit 10 receives an available write command (step 402), the memory system then enters a write procedure. Thereafter, the programming/erasing address related to the data to be written into is decoded from the write command (step 403). If the write command is correct, then a programming/erasing step is started (step 404), otherwise the write procedure is interrupted and ends.

The control unit 10 keeps on sending programming/erasing control signals and the programming/erasing address related to the data to the memory unit 20 until the programming/erasing time and cycle number within one unit of time (such as one second) is reached (step 404). The programming/erasing step 404 is performed for writing the data into the memory unit 20, wherein the programming/erasing time and/or cycle number per unit of time is a terminative condition for performing step 404, i.e. the programming/erasing step 404 is executed until the programming/erasing time and/or cycle number within one unit of time is reached. The data written in step 404 is then read back and checked to determine whether it is correct or not (step 405). If the verification result is correct, then the write procedure is completed and ends. Otherwise, a new setting of the programming/erasing time and/or cycle number per unit of time (terminative condition) is set at step 406, and the write procedure continues to perform steps 404 and 405 with the new setting of programming/erasing time and/or cycle number (terminative condition) per unit of time until the setting of the programming/erasing time and/or cycle number (per unit of time) being set step 406 is greater than the maximum values allowed. For example, when the setting of programming/erasing time has been set to the value greater than the maximum value allowed (such as 0.07 ms in FIG. 3); or the setting of cycle number per unit of time has been set to the value greater than the maximum value allowed (such as 40 in FIG. 3), the write procedure will be interrupted and ends. Just as described above, the successive programming/erasing is decided by the terminative condition.

The terminative condition is a combined arrangement of programming/erasing time and cycle number per unit of time. The terminative condition includes five bits configuration composed of three bits time code (duration bits) and two bits cycle code (cycle bits) as shown in FIG. 3 and FIG. 2. The (programming/erasing) time code of 000 means the programming/erasing time of 0.01 ms. The time code of 001 represents the time of 0.02 ms, and the time code of 010 does the time of 0.03 ms, and so on. The cycle code of 00 represents 10 cycles, and the cycle code of 01 represents 20 cycles, and so on. Each programming/erasing cycle is performed in the same way with the programming/erasing time. The write procedure continues until the data written is correct or the total programming/erasing cycle number has reached the setting of cycle number. For example, with the time code of 010 and the cycle code of 10, steps 404 and 405 are cyclically performed with the programming/erasing time of 0.03 ms until the rum cycles reach 30 times.

Figure 7:
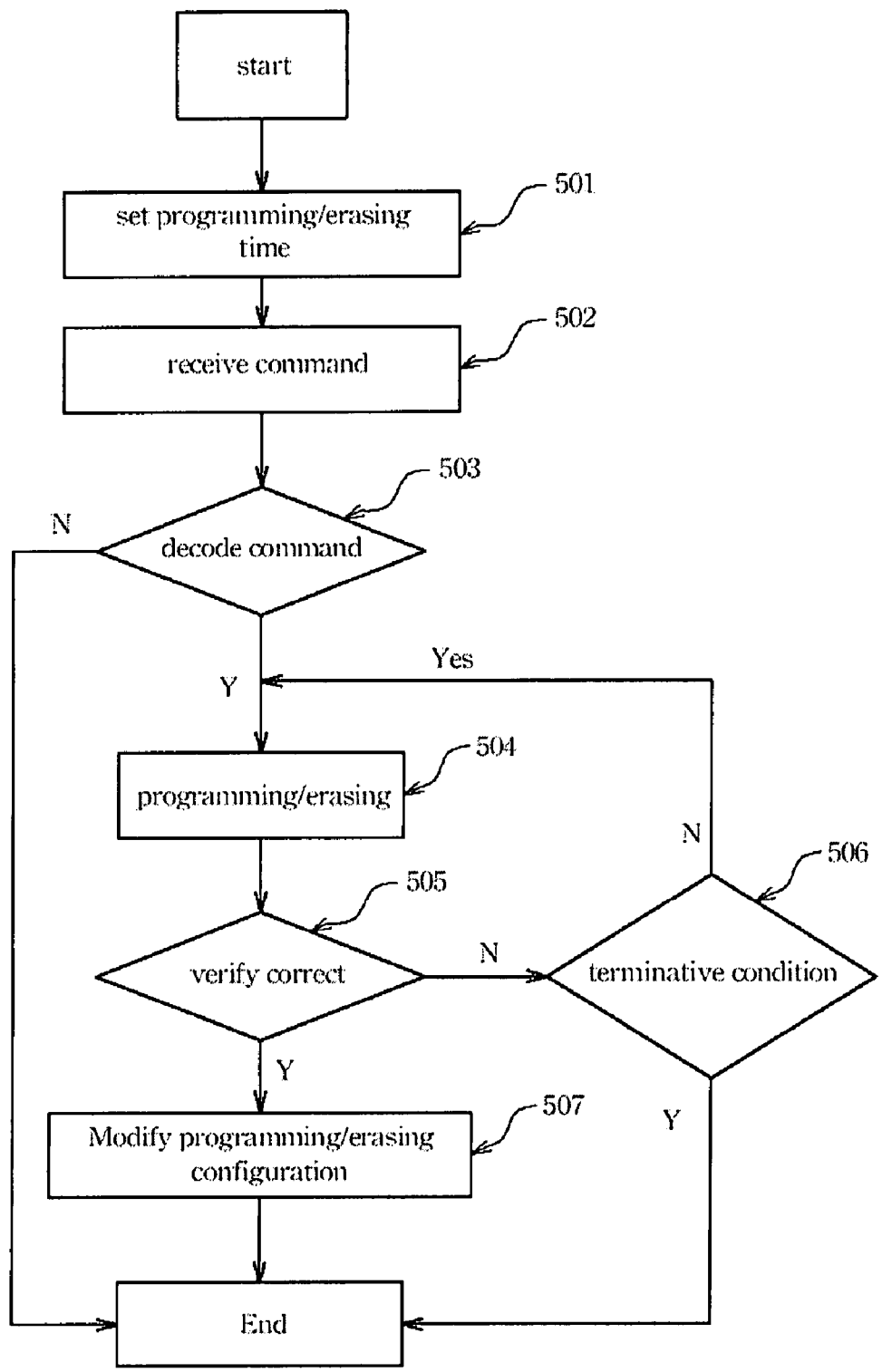
FIG. 7 depicts a schematic flow chart of an active programming/erasing function in a write mode according to another embodiment of the present invention.

Referring to FIG. 1, FIG. 6 and FIG. 7, FIG. 7 depicts a schematic flow chart of an active programming/erasing function in a write mode according to another embodiment of the present invention. In comparison with the passive programming/erasing function shown in FIG. 6, step 501-506 shown in FIG. 7 are similar to steps 401-406 shown in FIG. 6, and the main difference between the active and passive programming/erasing functions resides in step 507. At step 507, the control unit 10 modifies the configuration block in the memory unit 20 with the new setting of programming/erasing time and/or cycle number per unit of time obtained during the iteration of step 504 step 505 and step 506. In other words, an appropriate setting of programming/erasing time and/or cycle number per unit of time is stored in the configuration block in the memory unit 20 as the initial setting of programming/erasing time and/or cycle number per unit of time, and thus the next write procedure can directly use this appropriate programming/erasing time without repeating the iteration process, thereby obtaining high performance and prolonging lifetime of the memory system.

According to the forgoing embodiments, embodiments of the present invention have the advantages of manipulating the programming/erasing time of a memory unit without spending more time and cost, thereby overcoming the inconvenient design of a conventional memory unit, thus extending the reliability of the memory device and improving the precision in reading from and writing into the memory unit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for adjusting a programming/erasing time in a memory system, the method comprising:
   initializing the programming/erasing time to an initial programming/erasing time value;
   executing a programming/erasing step for writing data into the memory system, wherein the programming/erasing step is executed until the programming/erasing time is reached;
   executing a first verification step for verifying the data written into the memory system to determine if the data written into the memory system is correct so as to obtain a verification result;
   executing a setting step for setting the programming/erasing time to a new programming/erasing time value when the verification result is incorrect; and
   repeatedly executing the programming/erasing step for writing the data into the memory system after the programming/erasing time is set to the new programming/erasing time value.

2. The method of claim 1, wherein the setting step increases the programming/erasing time.

3. The method of claim 1, wherein the initial programming/erasing time value is stored in a configuration block of the memory system, the method further comprising:

modifying the configuration block to update the initial programming/erasing time value to the new programming/erasing time value.

4. The method of claim 1, further comprising:
repeatedly executing the first verification step after the step of repeatedly executing the programming/erasing step is performed.

5. The method of claim 4, further comprising:
repeatedly executing the setting step, the programming/erasing step and the first verification step in sequence, when the verification result is incorrect.

6. The method of claim 1, wherein the new programming/erasing time value is smaller than or equal to a predetermined maximum time value.

7. The method of claim 1, further comprising:
initializing a cycle number per unit of time to an initial cycle number value, wherein the programming/erasing step is executed until the cycle number within one unit of time is reached, and the setting step is executed for setting the cycle number per unit of time to a new cycle number value when the verification result is incorrect.

8. The method of claim 7, wherein the step of setting the programming/erasing time increases the cycle number per unit of time.

9. The method of claim 7, wherein the initial cycle number value is stored in a configuration block of the memory system, further comprising:
modifying the configuration block to update the initial cycle number value to the new cycle number value.

10. The method of claim 7, wherein the new cycle number value is smaller than or equal to a predetermined maximum cycle number value.

11. The method of claim 1, further comprising:
selecting a predetermined check sum method;
executing a read step for reading data from the memory system; and
executing a second verification step for verifying the data read from the memory system with the predetermined check sum method.

12. The method of claim 11, further comprising:
repeatedly executing the read step and the second verification step, when the predetermined check sum method finds errors in the data read from the memory system.

13. The method of claim 11, wherein the predetermined check sum method is odd or even parity check, longitudinal redundancy check (LRC), or cyclic redundancy check (CRC).

14. The method of claim 1, wherein the memory system is a memory system of RFID (Radio Frequency IDentification).

* * * * *